United States Patent [19]

Oike

[11] Patent Number: 5,378,980

[45] Date of Patent: * Jan. 3, 1995

[54] CROSS COIL TYPE INDICATING INSTRUMENT WITH AN EXTERNALLY ADJUSTABLE STOPPER PLATE

[75] Inventor: Yukio Oike, Shizuoka, Japan

[73] Assignee: Yazaki Corporation, Tokyo, Japan

[ * ] Notice: The portion of the term of this patent subsequent to Sep. 8, 2009 has been disclaimed.

[21] Appl. No.: 948,419

[22] Filed: Sep. 22, 1992

[30] Foreign Application Priority Data

Oct. 8, 1991 [JP] Japan ............... 3-081632[U]

[51] Int. Cl.6 ............................................. G01R 1/20
[52] U.S. Cl. ............................ 324/146; 324/154 R
[58] Field of Search ............ 324/146, 143, 144, 154 R, 324/154 PB, 155, 131; 235/144 R, 144 PN, 144 SP, 96, 97, 144 ME; 73/1 R, 498

[56] References Cited

U.S. PATENT DOCUMENTS

| | | | |
|---|---|---|---|
| 2,450,331 | 9/1948 | De Giers et al. | 324/146 |
| 4,090,131 | 5/1978 | Mas | 324/146 |
| 4,646,007 | 2/1987 | Faria | 324/146 |
| 4,724,601 | 2/1988 | MacManus et al. | 324/146 |
| 4,827,210 | 5/1989 | Lindig et al. | 324/146 |
| 5,061,891 | 10/1991 | Totsuka et al. | 324/146 |
| 5,146,158 | 9/1992 | Ooike | 324/146 |

FOREIGN PATENT DOCUMENTS 3-127267 12/1991 Japan .

*Primary Examiner*—Kenneth A. Wieder
*Assistant Examiner*—Jay M. Patidar
*Attorney, Agent, or Firm*—Armstrong, Westerman, Hattori, McLeland & Naughton

[57] ABSTRACT

A cross coil type indicating instrument is improved in that a coil bobbin keeps a torque sufficient to hold a stopper plate as a zero point stopper to prevent a positional deviation of the stopper plate after position adjustment and that a stable rotational torque is kept in the positional adjustment of the stopper plate with a jig to assure a reliable position adjustment. The stopper plate is held between an upper bobbin and a lower bobbin with a pinching pressure to inhibit a vertical motion thereof. Spring pieces are formed on an outer periphery of the stopper plate while contacting with the inner face of the lower bobbin with an elastic force. By a biasing force of the spring pieces, the stopper plate is held in the lower bobbin along matching faces between the upper bobbin and the lower bobbin with a substantially constant holding torque.

10 Claims, 3 Drawing Sheets

CROSS COIL TYPE INDICATING INSTRUMENT WITH AN EXTERNALLY ADJUSTABLE STOPPER PLATE

BACKGROUND OF THE INVENTION

1. Field of the Invention

The present invention relates to a cross coil type indicating instrument. More particularly, the invention relates to a cross coil type indicating instrument provided with a zero point stopper adjustable in position.

2. Description of the Related Art

There are conventional indicating instruments for automobiles in which an electric current changed depending upon a measured value is supplied to a pair of coils to generate magnetic fields perpendicular to each other and in which a magnetic rotor is rotated in a direction of a combined magnetic field obtained from the magnetic fields generated by the paired coils, whereby indicating the measured value with a pointer rotating with the magnet rotor.

FIG. 3 shows an instrument unit 1 such as a speedometer or a tachometer used in an indicating instrument of such a conventional type. A movement 2 of the instrument unit 1 has a coil bobbin 3, and two coils 4, 4 are wound around the coil bobbin 3 as being perpendicular to each other. A magnet rotor 5 of disk is disposed inside the coil bobbin 3 in the coils 4 with the S pole and the N pole being formed thereon, and a rotation shaft 6 is attached to a central portion of the magnet rotor 5, extending in an axial direction of the coil bobbin 3. The rotation shaft 6 and thus the magnet rotor 5 are freely rotatable with no current through the coils 4. As an electric current flows through the coils 4, the rotation shaft 6 is driven to rotate by a predetermined angle.

A dial plate 7 is attached to the upper face of the movement 2. The fore end of the rotation shaft 6 passes through the dial plate 7 when the movement 2 is mounted on the back face of the dial plate 7. A pointer 8 is fixed at the fore end of the rotation shaft 6.

There is zero return means provided in the movement 2, such as a hair spring (not shown) connected to the coil bobbin 3 at one end, or as a magnet for zero return (not shown). A biasing force of the hair spring or a magnetic force of the magnet for zero return returns the rotation shaft 6 to a predetermined zero position in the state of free rotation of the rotation shaft 6 without an electric current flow through the coils. A movement case 9 surrounds outside the coil bobbin 3 to shield the magnetic field. The instrument unit 1 is thus formed as explained.

In a conventional arrangement, a stopper pin (not shown) stands on the dial plate 7 as means to stop the pointer 8 fixed on the rotation shaft 6 at the zero point on the dial plate 7. The stopper pin stops the pointer 8 at the zero point.

Such an arrangement of the stopper pin on the dial plate 7 as described might give a feeling of complexity to a driver in view of a design on the dial plate. Also the arrangement inconveniently increases the number of components and of assembling steps.

Inventors have proposed a cross coil type indicating instrument as shown in FIGS. 4 and 5, which can properly return the pointer 8 to the zero point on the dial plate 7 without such a stopper pin on the dial plate 7 (Japanese Utility Model Application No Heisei 2-82766).

In the cross coil type indicating instrument proposed, a stopper plate 10 of annular thin plate is disposed between an upper bobbin 3a and a lower bobbin 3b of a coil bobbin 3, and a stop 11 is formed to project downward in FIG. 4 from an inner periphery of a stopper plate 10 to engage with an engagement plate 13 of an annular recess 12 formed on the upper face of a magnet rotor 5, whereby a pointer 8 fixed on a rotation shaft 6 of the magnet rotor 5 may be stopped at the zero point on the dial plate 7.

A protrusion 15 is formed on the outer periphery of the stopper plate 10 with teeth 15a entering a jig hole 14 formed in the outer periphery of the coil bobbin 3. The teeth 15a mesh with a jig (not shown) inserted into the jig hole 14, and the stopper plate 10 may be slightly moved along matching faces between the upper bobbin 3a and the lower bobbin 3b with a rotation of the jig. As the stopper plate 10 moves with use of the jig, the pointer 8 may be adjusted to return to the zero point on the dial plate 7 after completion of assembling of the instrument unit 1.

In the figures, numeral 16 denotes spring pieces, which are formed by upward bending at an inner periphery of the stopper plate 10. The spring pieces 16 contact with an inner face $3a_1$ of the upper bobbin $3a$, and thereby a lower face of the stopper plate 10 may contact with an upper edge $3b_1$ of the lower bobbin $3b$ with a biasing force of the spring pieces 16. By this arrangement, a torque is maintained constant to hold the stopper plate 10 sandwiched through the spring pieces 16 between the upper bobbin 3a and the lower bobbin 3b, so that a stable rotation torque may be provided in positional adjustment of the stopper plate 10 with the jig.

The above conventional indicating instrument has the following problems.

In the conventional indicating instrument, the spring pieces 16 bent upward at the inner periphery of the stopper plate 10 contact with the upper bobbin 3a, whereby the stopper plate 10 is sandwiched between the upper bobbin 3a and the lower bobbin 3b. In this arrangement, dimensions of the coil bobbin 3 itself of resin mold change with a stress upon a thermal expansion or upon a thermal contraction. This change in dimensions might cause a winding slack in the coils 4, 4 wound around the coil bobbin 3, which would result in reduction in compressive force of the wound coils 4, 4 acting on the coil bobbin 3. Since the stopper plate 10 is held as sandwiched between the upper bobbin 3a and the lower bobbin 3b with the compressive force, the holding torque of the stopper plate 10 will decrease with the reduction in compressive force. This results in movement of the stopper plate 10 already adjusted in position at a predetermined zero point, thereby to in turn move the zero point of the pointer 8. Further, the rotation torque of the stopper plate 10 in the position adjustment thereof with the jig becomes unstable.

SUMMARY OF THE INVENTION

The present invention has been accomplished considering the above points.

It is, therefore, an object of the present invention to provide a cross coil type indicating instrument in which a coil bobbin keeps a torque sufficient to hold a stopper plate as a zero point stopper to prevent a positional deviation of the stopper plate after position adjustment and in which a stable rotational torque is provided in the positional adjustment of the stopper plate with a jig to assure a reliable position adjustment.

The above object of the present invention can be achieved by a cross coil type indicating instrument comprising: a coil bobbin composed of an upper bobbin and a lower bobbin; a magnet rotor contained in the coil bobbin, rotatable about a rotation shaft on which a pointer is fixed at a fore end; a cross coil comprised of two coils wound around the coil bobbin perpendicular to each other, the cross coil, with an electric current flow through the two coils, making a composite magnetic field to rotate the magnet rotor by a predetermined angle to rotate the pointer; and a stopper plate disposed between the upper bobbin and the lower bobbin and adjustable in position of engagement with the magnet rotor, the stopper plate holding the pointer at a predetermined zero point under a zero point return without an electric current flow through the cross coil; wherein a spring means is provided on an outer periphery of the stopper plate while elastically contacting with an inner face of the coil bobbin.

According to the present invention, the spring means is formed on the outer periphery of the stopper plate to elastically contact with the inner face of the coil bobbin, so that the stopper plate may be held between the upper bobbin and the lower bobbin with the biasing force of the spring means. Therefore the present invention is different from the conventional indicators in which a stopper plate is held and sandwiched between an upper bobbin and a lower bobbin with a compressive force of coil winding wound around a coil bobbin. Therefore, the indicating instrument of the present invention is free of the influence from the coil winding slack or the like, assuring a stable holding torque of the stopper plate disposed in the coil bobbin.

In the above arrangement of the present invention, the spring means elastically contacts with the inner face of the upper bobbin of the coil bobbin or with an inner face of the lower bobbin of the coil bobbin.

Further, the spring means may be preferably integral with the stopper plate, for example by deforming a part of the stopper plate. The spring means elastically contacts with the coil bobbin with an elastic force of the deformed portion.

The stopper plate may be disposed between the magnet rotor and the lower bobbin or between the magnet rotor and the upper bobbin.

Further objects and advantages of the present invention will be apparent from the following description of the preferred embodiment of the invention as illustrated in the accompanying drawings.

DESCRIPTION OF THE PREFERRED EMBODIMENT

A preferred embodiment according to the present invention will be explained below with reference to FIGS. 1 and 2. Same numerals are given to same elements as in the conventional indicators as above explained.

Figure 1:
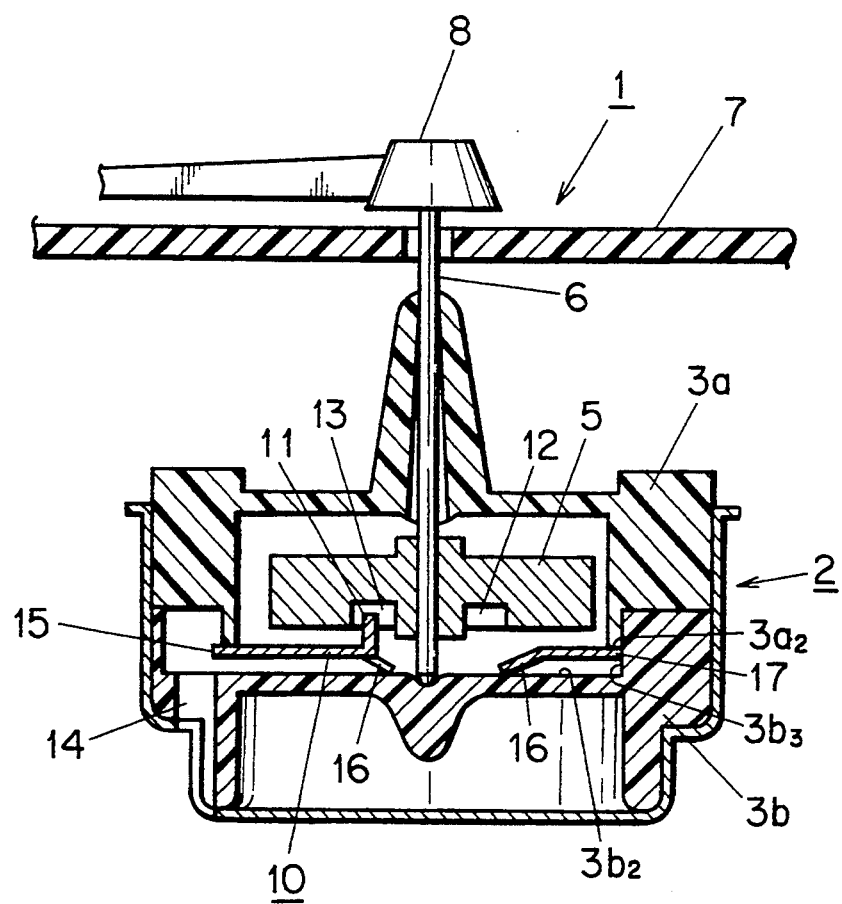
FIG. 1 is a vertical cross-sectional view of an instrument unit part to show an embodiment according to the present invention.
Figure 2:
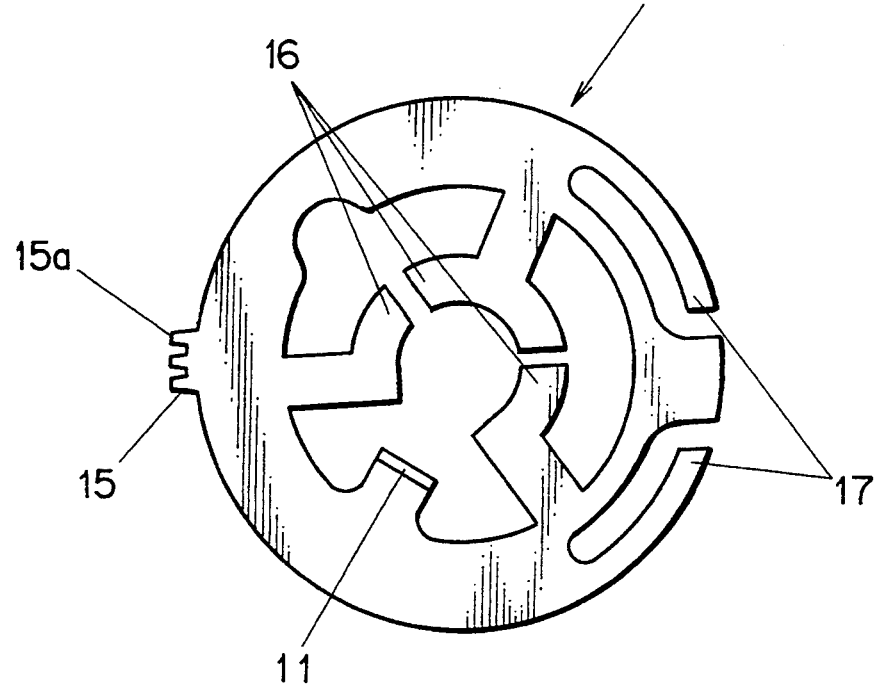
FIG. 2 is a plan view of a stopper plate in the embodiment of FIG. 1.
Figure 3:
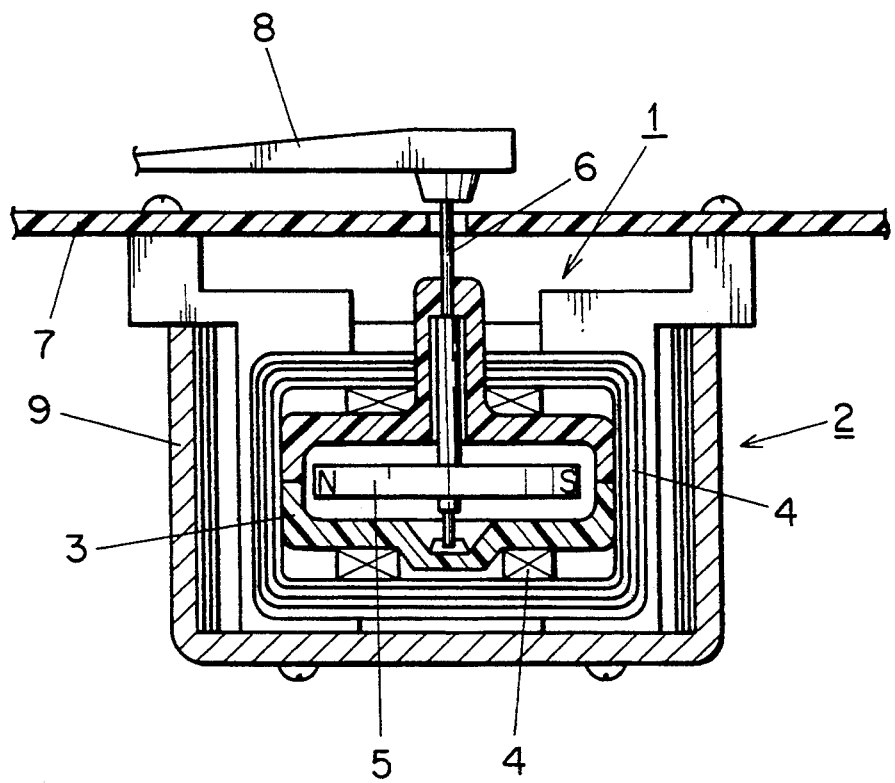
FIG. 3 is a vertical cross-sectional view to show a conventional cross coil type indicating instrument.
Figure 4:
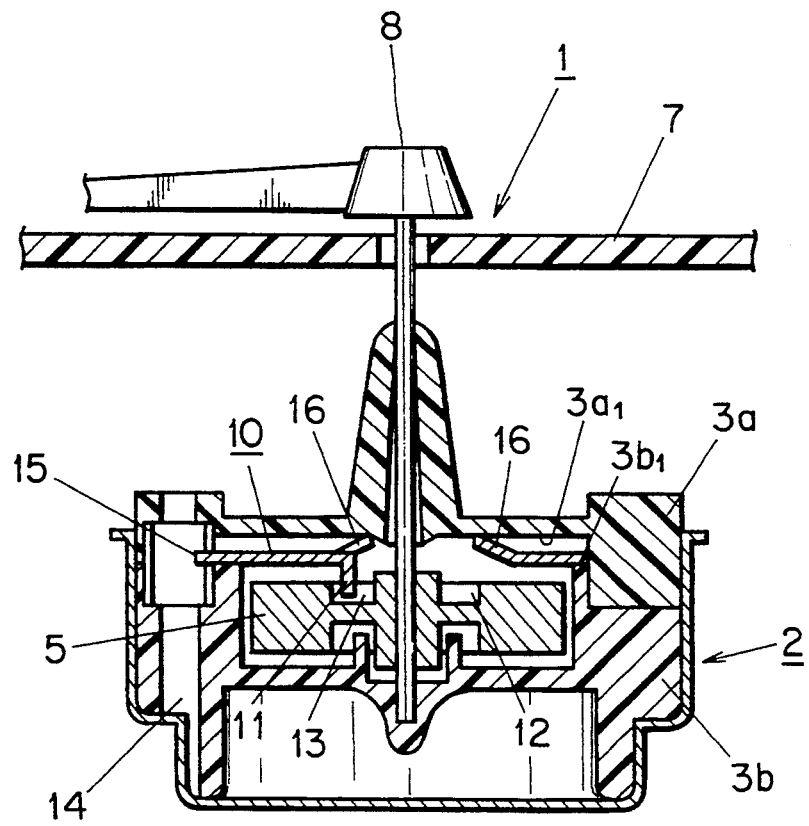
FIG. 4 is a vertical cross-sectional view to show another conventional cross coil type indicating instrument.
Figure 5:
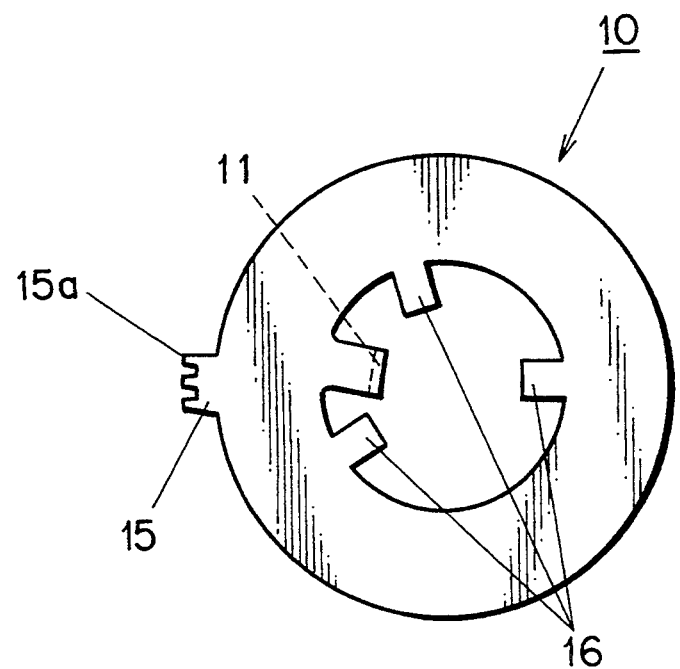
FIG. 5 is a plan view of a stopper plate in the conventional indicating instrument as shown in FIG. 4.

FIGS. 1 and 2 show the preferred embodiment of an instrument unit 1 according to the present invention. A movement 2 has a coil bobbin 3 composed of an upper bobbin 3a and a lower bobbin 3b. Two coils (not shown) are wound around the coil bobbin 3 as perpendicular to each other. A magnet rotor 5 of disk is disposed inside the coil bobbin 3 with the S pole and the N pole being formed thereon. A rotation shaft 6 is attached to the central portion of the magnet rotor 5 and extends in an axial direction of the coil bobbin 3. The fore end of the rotation shaft 6 passes through a dial plate 7, and a pointer 8 is fixed to the fore end of the rotation shaft 6. The rotation shaft 6, and thus the magnet rotor 5, are freely rotatable when no electric current flows through the coils. When an electric current flows through the coils, the rotation shaft 6 is driven to rotate by a predetermined angle.

Zero return means is provided in the movement 2, such as a hair spring (not shown) connected to the coil bobbin 3 at one end or as a zero return magnet (not shown). By a biasing force of the hair spring or by a magnetic force of the zero return magnet, the pointer 8 is returned to a predetermined zero point in the state in which the rotation shaft 6 is free to rotate without an electric current flow through the coils.

A stopper plate 10 of annular thin plate is disposed near matching faces between the upper bobbin 3a and the lower bobbin 3b of the coil bobbin 3. A stop 11 is formed to project upward in FIG. 1 at an inner periphery of the stopper plate 10. The stop 11 may be engaged with an engagement plate 13 of annular recess 12 formed on a lower face of the magnet rotor 5, so as to stop the pointer 8 urged toward the zero point at the zero point on the dial plate 7.

Further, a protrusion 15 is formed on an outer periphery of the stopper plate 10 with teeth 15a entering a jig hole 14 formed in an outer periphery of the coil bobbin 3. The teeth 15a mesh with a jig (not shown) inserted into the jig hole 14. As the jig is rotated, the stopper plate 10 may slightly move along the matching faces between the upper bobbin 3a and the lower bobbin 3b. Moving the stopper plate 10 with use of the jig allows adjustment of zero point such that the pointer 8 returns to the zero point on the dial plate 7 at the point of completion of assembly of the above instrument unit 1.

In addition, spring pieces 16 are formed at the inner periphery of the stopper plate 10 to project downward in FIG. 1. The spring pieces 16 contact with an inner face $3b_2$ of the lower bobbin 3b, whereby the upper face of the stopper plate 10 may contact with a lower edge $3a_2$ of the upper bobbin 3a with a biasing force of the spring pieces 16. The stopper plate 10 is held and sandwiched through the spring pieces 16 between the upper bobbin 3a and the lower bobbin 3b with a pinching pressure to inhibit a vertical motion thereof.

Another spring pieces 17 are formed on the outer periphery of the stopper plate 10 held between the upper bobbin 3a and the lower bobbin 3b with the pinching pressure to inhibit the vertical motion. The spring pieces 17 contact with an elastic force with the inner face 3b₃ of the lower bobbin 3b. The stopper plate 10 may be held in the lower bobbin 3b along the matching faces between the upper bobbin 3a and the lower bobbin 3b with a substantially constant holding torque through the biasing force of the spring pieces 17. The major holding force of the stopper plate 10 is given by the spring pieces 17 elastically contacting with the inner face 3b₃ of the lower bobbin 3b. The spring pieces 16 contacting with the inner face 3b₂ of the lower bobbin 3b are for the stopper plate 10 to be held with the pinching pressure to inhibit the vertical motion between the upper bobbin 3a and the lower bobbin 3b.

In the embodiment as described, the spring pieces 17 are formed on the outer periphery of the stopper plate 10 to elastically contact with the inner face 3b₃ of the lower bobbin 3b, so that the stopper plate 10 may be held with the biasing force of the spring pieces 17 in the lower bobbin 3b along the matching faces between the upper bobbin 3a and the lower bobbin 3b in the substantially constant holding torque. This arrangement is different from the conventional indicators in which the stopper plate 10 is sandwiched and held with the compressive force of winding of the coils 4, 4 around the coil bobbin 3 between the upper bobbin 3a and the lower bobbin 3b. Thus, the instrument of the present invention is free of influence of winding slack of the coils 4, thereby holding the stopper plate 10 disposed in the coil bobbin 3 with a stable holding torque. The stable holding torque of the stopper plate 10 by the coil bobbin 3 may prevent the positional deviation of the stopper plate 10 after it is adjusted in position to the predetermined zero point. Further, the rotation torque of the stopper plate 10 in the position adjustment with the jig may be made stable, assuring a reliable position adjustment.

The present invention is not limited to the above-described embodiment, but may be modified in various manners. Although the stopper plate 10 is disposed below the magnet rotor 5 in the above embodiment, the stopper plate 10 may be disposed above the magnet rotor 5. The same advantages as described may be enjoyed without the spring pieces 16 formed at the inner periphery of the stopper plate 10.

As explained, in the cross coil type indicating instrument according to the present invention, spring pieces are formed on the outer periphery of the stopper plate to elastically contact with the inner face of the upper bobbin or of the lower bobbin, whereby the stopper plate is held between the upper bobbin and the lower bobbin with the biasing force of the spring pieces. Therefore, the indicating instrument of the present invention is different from the conventional indicators in which the stopper plate is sandwiched and held between the upper bobbin and the lower bobbin with the compressive force of winding of the coils wound around the coil bobbin. The indicating instrument according to the present invention is free of the influence of the coil winding slack, so that a stable holding torque may be kept on the stopper plate disposed in the coil bobbin. Thus, the positional deviation may be effectively prevented of the stopper plate already adjusted in position at the predetermined zero point. Further, a reliable position adjustment may be carried out with the stable rotation torque of the stopper plate in the position adjustment with the jig.

Many widely different embodiments of the present invention may be constructed without departing from the spirit and scope of the present invention. It should be understood that the present invention is not limited to the specific embodiment described in the specification, except as defined in the appended claims.

What is claimed is:

1. A cross coil type indicating instrument comprising:
   a coil bobbin composed of an upper bobbin and a lower bobbin;
   a magnet rotor contained in said coil bobbin, rotatable about a rotation shaft on which a pointer is fixed at a fore end;
   a cross coil comprised of two coils wound around said coil bobbin perpendicular to each other, said cross coil, with an electric current flow through said two coils, making a composite magnetic field to rotate said magnet rotor by a predetermined angle to rotate said pointer; and
   a stopper plate disposed between the upper bobbin and the lower bobbin, adjustable in position of engagement with said magnet rotor, said stopper plate holding said pointer at a predetermined zero point under a zero point return without an electric current flow through the cross coil;
   wherein spring means is provided on an outer periphery of said stopper plate while elastically contacting with an inner circumferential face of said coil bobbin to urge said stopper plate substantially in a radial direction thereof.

2. A cross coil type indicating instrument according to claim 1, wherein said spring means elastically contacts with an inner face of the upper bobbin of the coil bobbin.

3. A cross coil type indicating instrument according to claim 1, wherein said spring means elastically contacts with an inner face of the lower bobbin of the coil bobbin.

4. A cross coil type indicating instrument according to claim 1, wherein said spring means is integral with said stopper plate.

5. A cross coil type indicating instrument according to claim 1, wherein said spring means is formed by deforming a portion of said stopper plate.

6. A cross coil type indicating instrument according to claim 5, wherein said spring means elastically contacts with said coil bobbin with an elastic force of the deformed portion.

7. A cross coil type indicating instrument according to claim 1, wherein said stopper plate is disposed between the magnet rotor and the lower bobbin.

8. A cross coil type indicating instrument according to claim 1, wherein said stopper plate is disposed between the magnet rotor and the upper bobbin.

9. A stopper plate for the cross coil type indicating instrument as set forth in claim 1, comprising: an annular portion; a stop for engagement with the magnet rotor; spring pieces for contact with the inner face of said coil bobbin inside said annular portion; teeth for zero point adjustment; and spring means formed by bending on the outer periphery of said annular portion.

10. A cross coil type indicating instrument according to claim 1, wherein second spring means is further provided on an inner periphery of said stopper plate for elastically contacting with at least one of an inner upper face or inner lower face of said coil bobbin to urge the stopper plate in an axial direction thereof.

* * * * *